United States Patent
Huang et al.

(10) Patent No.: US 9,136,797 B2
(45) Date of Patent: Sep. 15, 2015

(54) ADAPTIVE HARMONIC DISTORTION SUPPRESSION IN AN AMPLIFIER UTILIZING NEGATIVE GAIN

(71) Applicant: Broadcom Corporation, Irvine, CA (US)

(72) Inventors: Kuo-J Huang, Irvine, CA (US); Delong Cui, Tustin, CA (US); Jun Cao, Irvine, CA (US); Afshin Doctor Momtaz, Laguna Hills, CA (US); Iuri Mehr, Irvine, CA (US); Ramon Alejandro Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 163 days.

(21) Appl. No.: 14/042,274

(22) Filed: Sep. 30, 2013

(65) Prior Publication Data

US 2015/0008982 A1    Jan. 8, 2015

Related U.S. Application Data

(60) Provisional application No. 61/843,403, filed on Jul. 7, 2013.

(51) Int. Cl.
*H03F 3/45*    (2006.01)
*H03F 1/32*    (2006.01)

(52) U.S. Cl.
CPC ............ *H03F 1/3205* (2013.01); *H03F 1/3211* (2013.01); *H03F 1/3241* (2013.01); *Y10T 29/49016* (2015.01)

(58) Field of Classification Search
USPC ....................................... 330/254, 124 R, 295
IPC .......................................................... H03F 3/45
See application file for complete search history.

(56) References Cited

U.S. PATENT DOCUMENTS

| | | | | |
|---|---|---|---|---|
| 3,895,306 | A * | 7/1975 | Rebeles | 330/271 |
| 6,842,071 | B1 * | 1/2005 | Retz et al. | 330/133 |
| 2003/0035070 | A1 * | 2/2003 | Fanous et al. | 348/707 |

* cited by examiner

*Primary Examiner* — Patricia T Nguyen
(74) *Attorney, Agent, or Firm* — Fiala & Weaver, P.L.L.C.

(57) ABSTRACT

Techniques are described herein that adaptively suppress harmonic distortion in an amplifier utilizing negative gain. The amplifier includes a first amplifier stage and a second amplifier stage, which are coupled in parallel. The first amplifier stage has a positive gain. The second amplifier stage has a negative gain to suppress total harmonic distortion of a system that includes the amplifier. The amplifier further includes shunt-peaking circuitry coupled to the first amplifier stage and the second amplifier stage to increase a maximum operating frequency at which the amplifier is capable of operating.

20 Claims, 12 Drawing Sheets

ADAPTIVE HARMONIC DISTORTION SUPPRESSION IN AN AMPLIFIER UTILIZING NEGATIVE GAIN

CROSS-REFERENCE TO RELATED APPLICATION(S)

This application claims the benefit of U.S. Provisional Application No. 61/843,403, filed Jul. 7, 2013, the entirety of which is incorporated by reference herein.

BACKGROUND

1. Technical Field

The subject matter described herein relates to amplifiers.

2. Background

Modern communication systems are increasingly utilizing receivers that include an analog-to-digital converter (ADC). Such receivers are often referred to as ADC-based receivers. An ADC-based receiver typically includes a variable gain amplifier (VGA) at the front end of the receiver to provide a relatively constant input amplitude to the ADC. It is desirable for the amplifier to generate a relatively low amount of distortion in order to improve performance of the receiver. An ideal amplifier provides constant gain independent of an amplitude of an input signal. However, due to variations that occur during processing of the amplifier, the amplifier commonly suffers from gain non-linearity. For instance, the gain of the amplifier typically is reduced as the magnitude of the input signal becomes greater, which results in harmonic distortion in an output signal of the amplifier. Such harmonic distortion often degrades the signal to noise and distortion ratio (SINAD) of the receiver. Furthermore, any of a variety of other non-linearity sources in the receiver can further degrade the SINAD of the receiver.

BRIEF SUMMARY

Methods, systems, and apparatuses are described for adaptively suppressing harmonic distortion in an amplifier utilizing negative gain, substantially as shown in and/or described in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1:
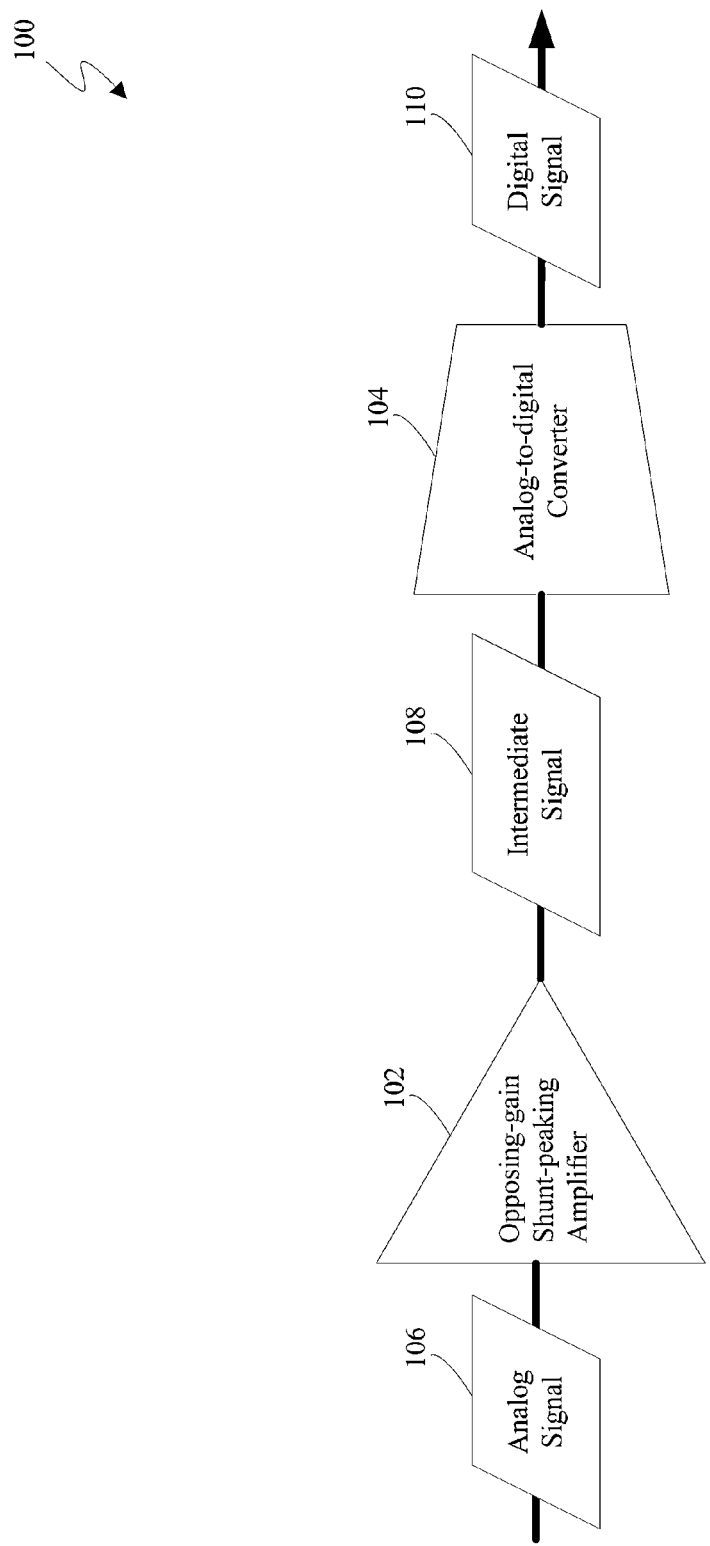
FIG. 1 is a block diagram of an example ADC-based receiver in accordance with an embodiment described herein.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

A variety of techniques have been proposed for reducing the amount of distortion generated by a VGA. In a first example, overdrive on a differential pair of transistors in the VGA may be increased by increasing the bias current of the differential pair. The purpose of increasing the overdrive is to provide sufficient energy to amplify relatively large input signals. However, the increased overdrive is characterized by a greater bias current passing through the relatively small input devices.

In a second example, the differential pair in the VGA is source-degenerated. For instance, the source degeneration may be used to reduce the gain of the VGA. However, the source-degenerated pair loses its effectiveness once the differential pair is out of saturation due to large-signal input.

In a third example, the VGA includes a dual differential pair (e.g., with cascade loading). For instance, a first differential pair may be used to amplify a positive portion of an input signal, and a second differential pair may be used to amplify a negative portion of the input signal. However, the dual differential pair adds layout overhead, which may limit the speed of the amplifier. Moreover, finding the optimal DC-biasing point for constant transconductance (gm) may be relatively difficult to find using a dual differential pair.

In a fourth example, the VGA includes a regulated cascade transistor combination. The purpose of the regulated cascade is to cause an output of the VGA to be more constant so that transconductance of the VGA is more constant across a range of input signal amplitudes. However, the regulated cascade utilizes additional power and relatively greater supply voltage.

In a fifth example, the VGA includes a feedback loop. The purpose of the feedback loop is to cause the gain of the VGA to be more constant. However, designing a feedback loop to operate effectively at a speed of interest (e.g., 8 GHz) may be relatively difficult.

Various approaches are described herein for, among other things, adaptively suppressing harmonic distortion in an amplifier utilizing negative gain. An example system is described. The system includes a first amplifier stage, a second amplifier stage, and shunt-peaking circuitry. The first amplifier stage has a positive gain. The second amplifier stage has a negative gain to suppress total harmonic distortion (THD) of the system. The first amplifier stage and the second amplifier stage are coupled in parallel. The shunt-peaking circuitry is coupled to the first amplifier stage and the second amplifier stage. The shunt-peaking circuitry is configured to increase a maximum operating frequency at which the system is capable of operating.

An example method of suppressing harmonic distortion in a system that has an overall gain, which is based on a positive gain of a first amplifier stage and a negative gain of a second amplifier stage, is described. In accordance with this method, the positive gain is applied to an input signal to generate a first output signal that includes harmonic distortion. The negative gain is applied to the input signal to generate a second output signal that is configured to compensate for the harmonic distortion in the first output signal. The first output signal and the second output signal are combined to provide an overall output signal based on the overall gain. Shunt-peaking circuitry that is coupled between a reference potential and the first and second amplifier stages is used to increase a maximum operating frequency at which the system is capable of operating.

An example method of making a system that suppresses harmonic distortion is described. In accordance with this method, a first amplifier stage having a positive gain is fabricated. A second amplifier stage coupled in parallel with the first amplifier stage is fabricated. The second amplifier stage has a negative gain to suppress total harmonic distortion of the system. Shunt-peaking circuitry coupled to the first amplifier stage and the second amplifier stage is fabricated. The shunt-peaking circuitry is configured to increase a maximum operating frequency at which the system is capable of operating.

The adaptive harmonic distortion suppression techniques described herein have a variety of benefits as compared to conventional distortion suppression techniques. For example, the techniques described herein may be capable of reducing (e.g., cancelling) harmonic distortion in an amplifier while the amplifier operates at a relative high frequency (e.g., eight gigahertz (GHz), 10 GHz, etc.). In accordance with this example, such techniques may not reduce a bandwidth of the amplifier in order to suppress the distortion.

In another example, the techniques described herein may provide better harmonic distortion suppression outside a linear region of the amplifier, as compared to conventional techniques. In accordance with this example, the techniques described herein may provide such better suppression with a relatively low (e.g., negligible) amount of increase in current that is drawn by the amplifier. An increase in the headroom of the amplifier due to inclusion of a negative-gain amplifier stage in the amplifier may relatively small (e.g., negligible). For instance, the increase in the headroom may be 1% or less, 2% or less, or 3% or less. The amplifier may include a shunt-peaked inductor, which can be configured (e.g., optimized) independently and compensate for additional loading of the main amplifier by the negative-gain amplifier.

The techniques described herein may be compatible with existing solutions to provide better distortion suppression. An existing amplifier may be configured as described herein by swapping part of the input differential pair connection with one extra connection to the current source. The non-linearity (i.e., harmonic distortion) suppression can be programmed through a current DAC with relatively little change to the gain of the amplifier. The techniques may provide relatively accurate corner tracking of process, voltage, and temperature (PVT) variation. If the main amplifier becomes more nonlinear due to PVT variation, the negative-gain amplifier may become more nonlinear as well, and/or vice versa. Adaptive control may be used to vary the current DAC for the differential pair in the negative-gain amplifier to suppress not only the THD from the amplifier itself but also the non-linearity of other sources by pre-distorting the input for the following stages and/or post-distorting the output of the precedent stages.

II. Example Adaptive Harmonic Distortion Suppression Embodiments

FIG. 1 is a block diagram of an example ADC-based receiver 100 in accordance with an embodiment described herein. Generally speaking, receiver 100 is configured to provide a digital representation of a signal based on an analog representation of the signal. In the discussion below, the digital representation is referred to as a digital signal, and the analog representation is referred to as an analog signal.

As shown in FIG. 1, receiver 100 includes an opposing-gain shunt peaking amplifier 102 and an analog-to-digital converter (ADC) 104. Amplifier 102 is configured to amplify an analog signal 106 to provide an intermediate signal 108. Amplifier 102 includes a plurality of amplifier stages. Each amplifier stage in a first subset of the plurality of amplifier stages has a positive gain. Each amplifier stage in a second subset of the plurality of amplifier stages has a negative gain. The positive gain and the negative gain are referred to as opposing gains. An absolute value of the negative gain may be less than an absolute value of the positive gain. Each of the first subset and the second subset may have any suitable number of amplifier stages (e.g., 1, 2, 3, 4, and so on). Outputs of the first subset and the second subset are combined to provide the intermediate signal 108.

Amplifier 102 further includes shunt-peaking circuitry, which is configured to increase a maximum operating frequency at which receiver 100 is capable of operating. For instance, the maximum operating frequency may be 8 GHz or greater, 10 GHz or greater, etc. The shunt-peaking circuitry may be configured to compensate for loading of the first subset that is caused by the second subset.

ADC 104 is configured to convert the intermediate signal 108, which is an amplified version of the analog signal 106, to a digital signal 110. It will be recognized that informational content of digital signal 110 may include some or all of (e.g., may be same as) informational content of analog signal 106.

Figure 2:
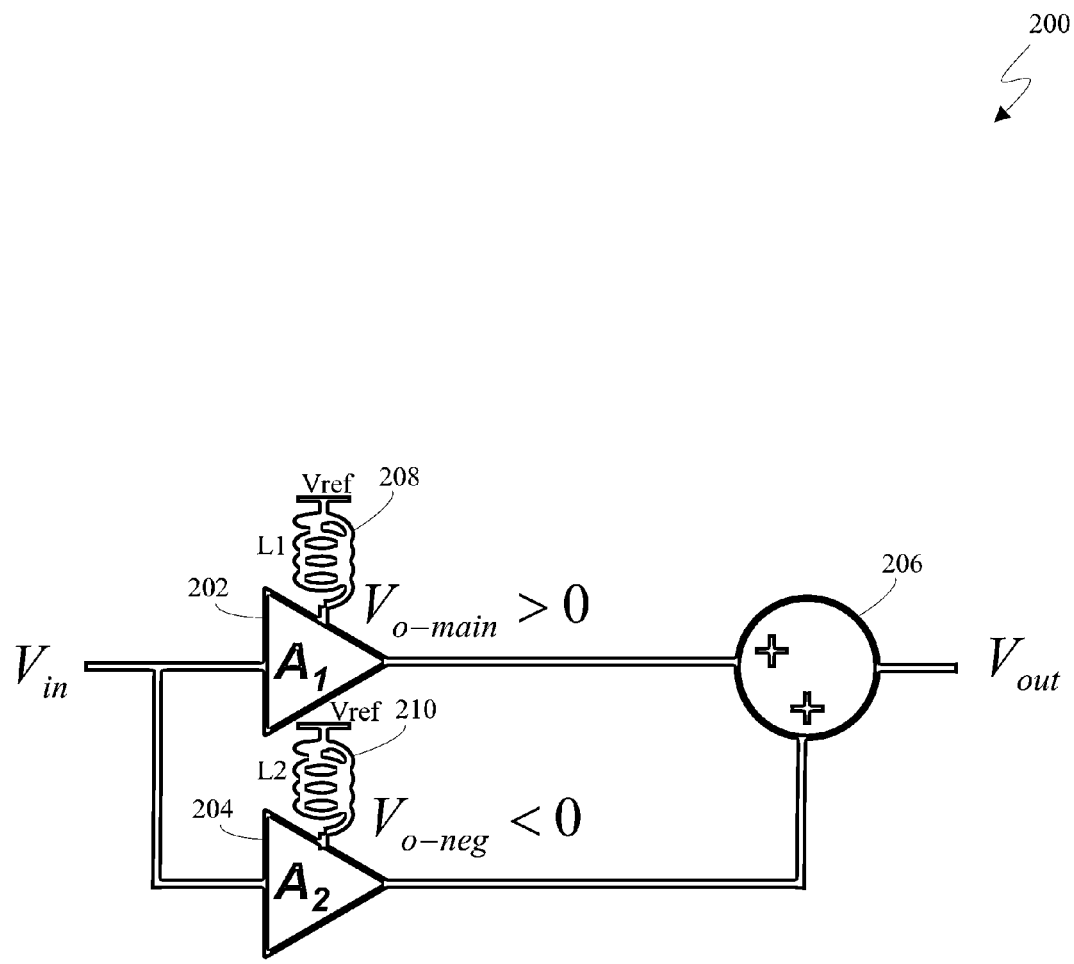
FIGS. 2 and 6-8 are block diagrams of example implementations of an opposing-gain shunt-peaking amplifier shown in FIG. 1 in accordance with embodiments described herein.

FIG. 2 is a block diagram of an opposing-gain shunt-peaking amplifier 200, which is an example implementation of opposing-gain shunt peaking amplifier 102 shown in FIG. 1, in accordance with an embodiment described herein. Generally speaking, amplifier 200 operates to provide a gain that is more constant over a range of input amplitudes than conventional amplifiers. Amplifier 200 includes a main amplifier 202 (labeled A1), a negative-gain amplifier 204 (labeled A2), a combiner 206, a first inductor 208 (labeled L1), and a second inductor 210 (labeled L2).

Main amplifier 202 (a.k.a. main amplifier stage) amplifies an input signal (Vin) to provide a first output signal (Vo-main). Main amplifier 202 has a relatively larger positive gain when an amplitude of the input signal is relatively small. A magnitude of the positive gain of main amplifier 202 may reduce to zero as the amplitude of the input signal becomes relatively large.

Negative-gain amplifier 204 (a.k.a. negative-gain amplifier stage) amplifies the input signal (Vin) to provide a second output signal (Vo-neg). Negative-gain amplifier 204 has a relatively larger negative gain (i.e., a more negative gain) when the amplitude of the input signal is relatively small. A magnitude of the negative gain of negative-gain amplifier 204 may reduce to zero as the amplitude of the input signal becomes relatively large.

Combiner 206 combines (e.g., adds) the first output signal (Vo-main) and the second output signal (Vo-neg) to provide an output voltage (Vout). By combining Vo-main and Vo-neg, the overall gain of amplifier 200 may become less dependent on input amplitude (e.g., more constant over input amplitude). Negative-gain amplifier 204 may be smaller than main amplifier 202, though the scope of the example embodiments is not limited in this respect. For instance, transistors that are included in main amplifier 202 may be larger than transistors that are included in negative-gain amplifier 204.

First inductor 208 and second inductor 210 constitute shunt-peaking circuitry. Shunt peaking circuitry is circuitry that is configured to increase a maximum operating frequency at which an amplifier (e.g., amplifier 200) or a system that includes the amplifier is capable of operating. The shunt peaking circuitry need not necessarily include first inductor 208 and second inductor 210. For instance, the shunt peaking circuitry may include circuit elements in lieu of first inductor 208 and second inductor 210. The shunt peaking circuitry may include circuit elements in addition to first inductor 208 and second inductor 210.

First inductor 208 is coupled between a control node of main amplifier 202 and a reference voltage (Vref). First inductor 208 provides inductor shunt-peaking for main amplifier 202.

Second inductor 210 is coupled between a control node of negative-gain amplifier 204 and the reference voltage. Second inductor 210 provides inductor shunt-peaking for negative-gain amplifier 204.

Compensation for additional loading of main amplifier 202 caused by negative-gain amplifier 204 may be achieved by adjusting an inductance of first inductor 208 and/or an inductance of second inductor 210.

Figure 3:
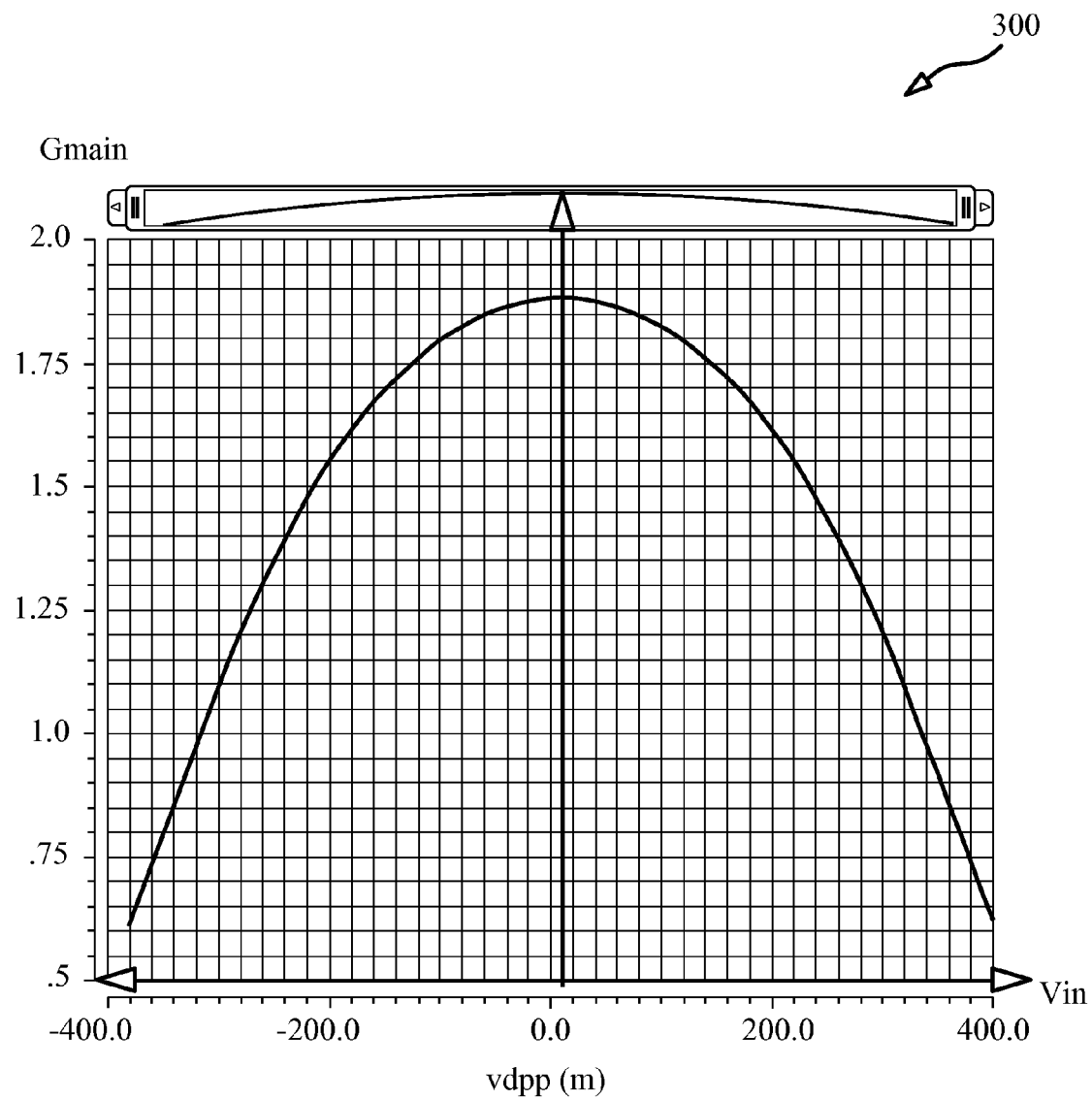
FIG. 3 shows an example plot of a gain of a main amplifier shown in FIG. 2 with respect to the input signal in accordance with an embodiment described herein.

FIG. 3 shows an example plot 300 of a gain (Gmain) of main amplifier 202 shown in FIG. 2 with respect to the input signal (Vin) in accordance with an embodiment described herein. As shown in FIG. 3, Gmain is greatest when the amplitude of the input signal is zero. Gmain generally decreases toward zero as the amplitude of the input signal increases. For illustrative purposes, the gain (Gmain) of main amplifier 202 may be described by the following equation, though the scope of the example embodiments is not limited in this respect:

$$G_{main} = \frac{\delta V_{o-main}}{\delta V_{in}} \quad \text{(Equation 1)}$$

Figure 4:
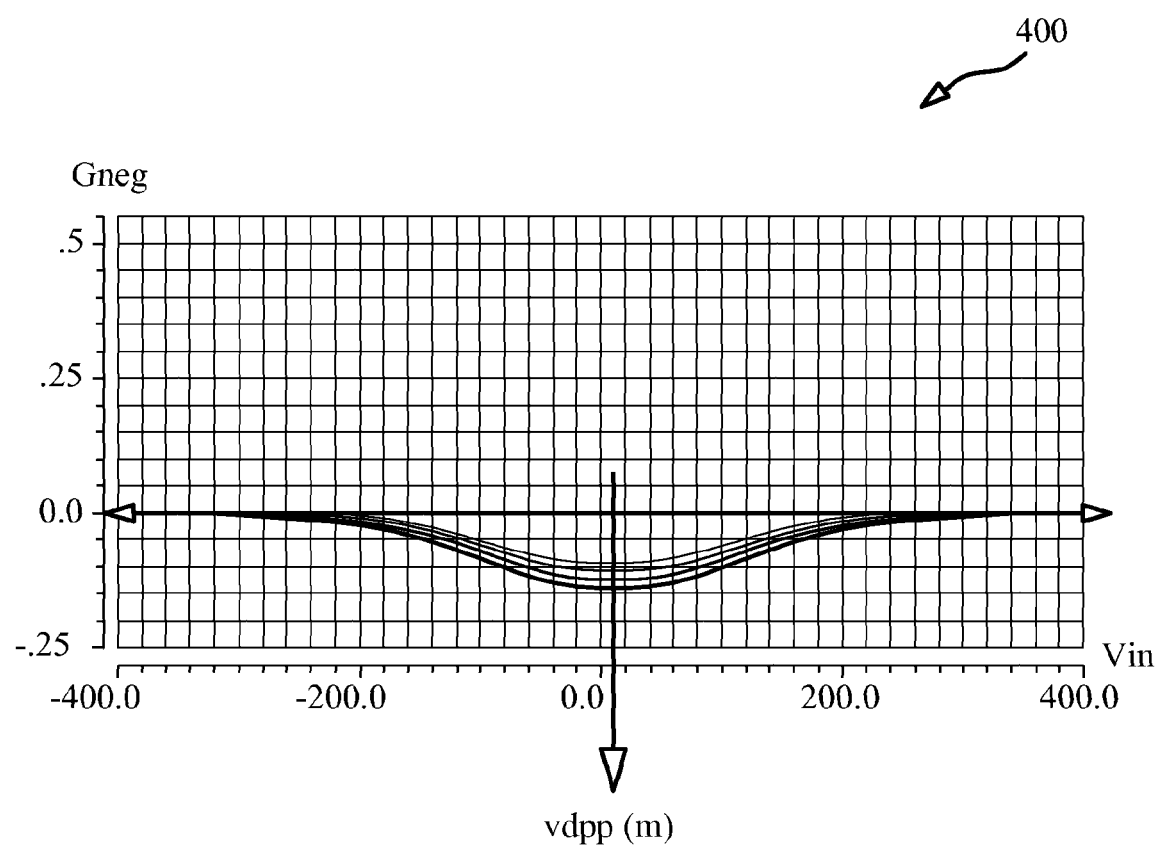
FIG. 4 shows an example plot of a gain of a negative-gain amplifier shown in FIG. 2 with respect to the input signal in accordance with an embodiment described herein.

FIG. 4 shows an example plot 400 of a gain (Gneg) of negative-gain amplifier 204 shown in FIG. 2 with respect to the input signal (Vin) in accordance with an embodiment described herein. As shown in FIG. 4, Gneg is most negative when the amplitude of the input signal is zero. Gneg generally increases toward zero as the amplitude of the input signal increases. For illustrative purposes, the gain (Gneg) of negative-gain amplifier 204 may be described by the following equation, though the scope of the example embodiments is not limited in this respect:

$$G_{neg} = \frac{\delta V_{o-neg}}{\delta V_{in}} \quad \text{(Equation 2)}$$

Figure 5:
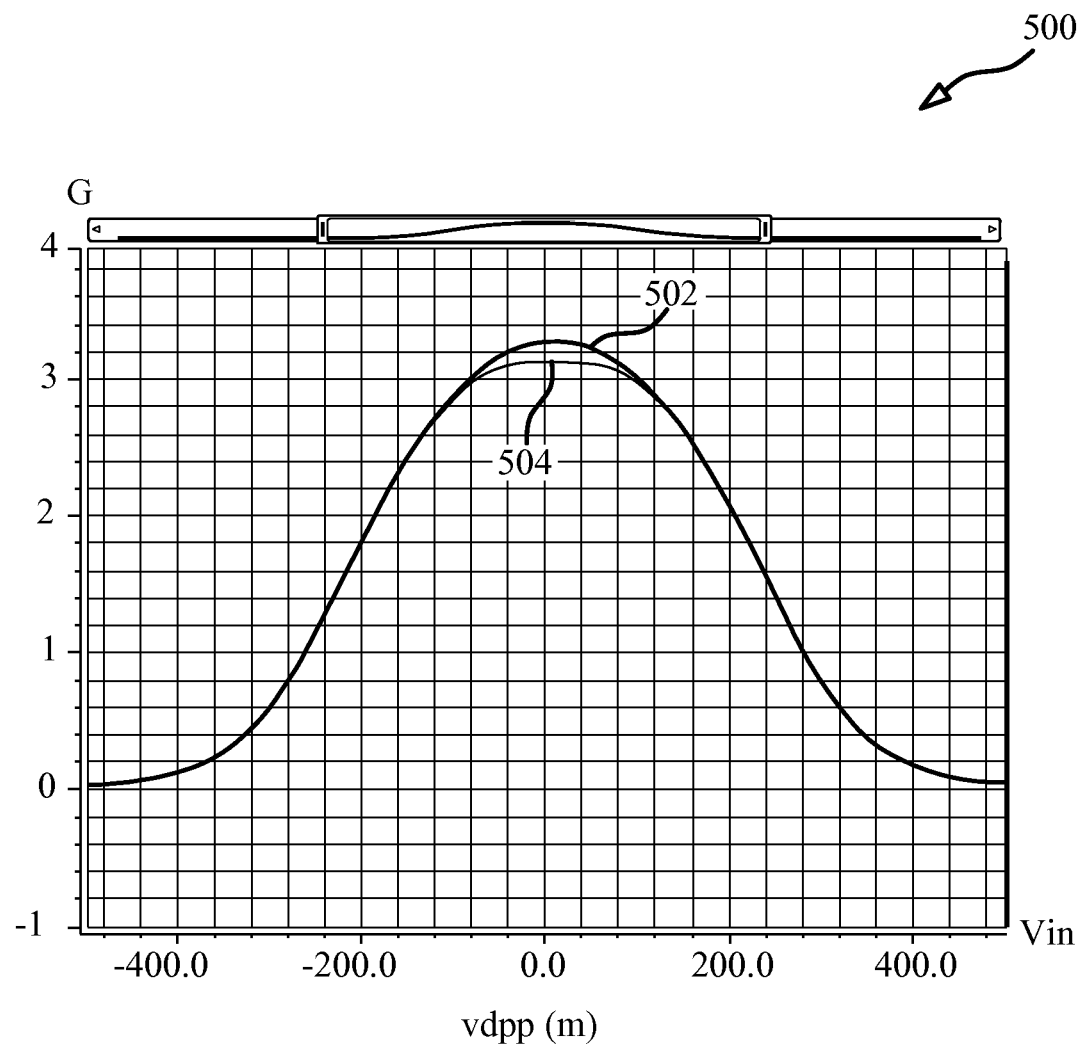
FIG. 5 shows example plots of an overall gain of an opposing-gain shunt-peaking amplifier shown in FIG. 2 with respect to the input signal in accordance with an embodiment described herein.

FIG. 5 shows example plots 502 and 504 of an overall gain (G) of opposing-gain shunt-peaking amplifier 200 shown in FIG. 2 with respect to the input signal (Vin) in accordance with an embodiment described herein. As shown in FIG. 5, G is greatest for both plots 502 and 504 when the amplitude of the input signal is zero. G generally decreases toward zero as the amplitude of the input signal increases. Plot 502 represents the relationship between the overall gain and the input signal when negative-gain amplifier 204 is not included in amplifier 200. Plot 504 represents the relationship between the overall gain and the input signal when negative-gain amplifier 204 is included in amplifier 200. As depicted in FIG. 5, plot 502 and plot 504 substantially overlap, except when the amplitude of the input signal is relatively small. When the amplitude of the input signal is relatively small, the overall gain of amplifier 200 is less for plot 504 than for plot 502. Accordingly, including negative-gain amplifier 204 in amplifier 200 causes the overall gain of amplifier 200 to be more constant over the range of input amplitudes shown in FIG. 5.

For illustrative purposes, the overall gain (G) of amplifier 200 may be described by the following equation, though the scope of the example embodiments is not limited in this respect:

$$G = \frac{\delta V_{out}}{\delta V_{in}} \quad \text{(Equation 3)}$$

Figure 6:
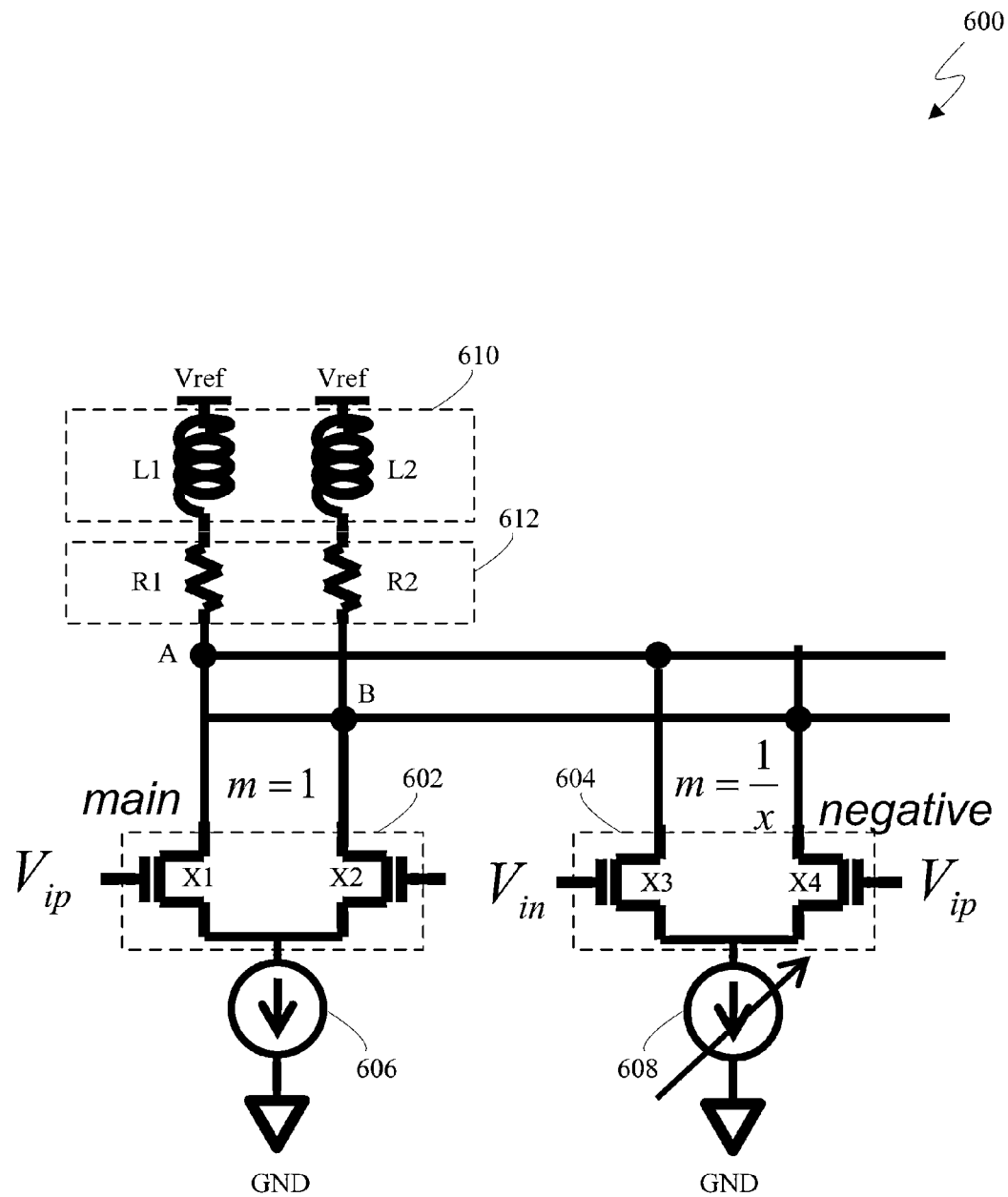

FIG. 6 is a block diagram of an opposing-gain shunt-peaking amplifier 600, which is an example implementation of opposing-gain shunt peaking amplifier 102 shown in FIG. 1, in accordance with an embodiment described herein. Amplifier 600 includes a main amplifier 602, a negative-gain amplifier 604, a first current source 606, a second current source 608, shunt-peaking circuitry 610, and resistor circuitry 612. Main amplifier 602 includes a first transistor X1 and a second transistor X2 configured as a first differential pair. A drain of first transistor X1 is coupled to node A. A source of first transistor X1 is coupled to first current source 606. A gate of first transistor X1 is coupled to a first input voltage Vip. A drain of second transistor X2 is coupled to node B. A source of second transistor X2 is coupled to first current source 606. A gate of second transistor X2 is coupled to a second input voltage Vin.

Negative-gain amplifier 604 includes a third transistor X3 and a fourth transistor X4 configured as a second differential pair. A drain of third transistor X3 is coupled to node A. A source of third transistor X3 is coupled to second current source 608. A gate of third transistor X3 is coupled to the second input voltage Vin. A drain of fourth transistor X4 is coupled to node B. A source of fourth transistor X4 is coupled to second current source 608. A gate of fourth transistor X4 is coupled to the first input voltage Vip. Accordingly, negative-gain amplifier 604 has a reverse input configuration as compared to main amplifier 602.

As shown in FIG. 6, a variable m having a value of one corresponds to main amplifier 602, and the variable m having a value of 1/x corresponds to negative-gain amplifier 604. The variable m may represent a gain (e.g., a normalized gain) or a size (e.g., a normalized size) for each of main amplifier 602 (e.g., the first differential pair) and negative-gain amplifier 604 (e.g., the second differential pair). For instance, a size of an amplifier may indicate a cumulative number of gate fingers that are included in the amplifier, an area defined by the gate fingers, a length of the gate fingers, etc. A gain or size of main amplifier 602 is shown to equal one in FIG. 6 for illustrative purposes (depicted as m=1), though the scope of the example embodiments is not limited in this respect. It will be recognized that the gain of main amplifier 602 may be any suitable value. Moreover, the size of main amplifier 602 may be any suitable value.

An absolute value of a gain or a size of negative-gain amplifier 604 is shown to be less than one in FIG. 6 for illustrative purposes (depicted as m=1/x, where x is a real number (e.g., integer or non-integer) greater than one), though the scope of the example embodiments is not limited in this respect. It will be recognized that the gain of negative-gain amplifier 604 may be any suitable value. Moreover, the size of negative-gain amplifier 604 may be any suitable value.

First current source 606 is coupled between main amplifier 602 and a ground potential GND. Second current source 608 is coupled between negative-gain amplifier 604 and the ground potential GND. Second current source 608 is shown to be variable for illustrative purposes, though the scope of the example embodiments is not limited in this respect. It will be recognized that each of first current source 606 and second current source 608 may be variable or not variable.

Resistor circuitry 612 includes a first resistor R1 and a second resistor R2. First resistor R1 is coupled between shunt-peaking circuitry 610 and node A. Second resistor R2 is coupled between shunt-peaking circuitry 610 and node B.

Shunt-peaking circuitry 610 includes a first inductor L1 and a second inductor L2 for illustrative purposes. First inductor L1 is coupled between a reference voltage Vref and first resistor R1. Second inductor L2 is coupled between the reference voltage and second resistor R2. By incorporating inductor shunt-peaking circuitry 610, amplifier 600 may be capable of operating at relatively high frequencies (e.g., >8 GHz, >10 GHz, etc.).

The non-linearity of negative-gain amplifier 604 may be programmed by varying a bias current of negative-gain amplifier 604. For instance, second current source 608 may be adjusted to increase or decrease an extent of the non-linearity of negative-gain amplifier 604. Changing the non-linearity of negative-gain amplifier 604 may cause negative-gain amplifier 604 and/or amplifier 600 to provide more or less harmonic suppression. In an example embodiment, main amplifier 602 (including the first differential pair X1 and X2), negative-gain amplifier 604 (including the second differential pair X3 and X4), and second current source 608 are included in a common (i.e., same) array. For instance, the common array may correspond to a common region of a semiconductor wafer on which main amplifier 602, negative-gain amplifier 604, and second current source 608 are fabricated. Including main amplifier 602, negative-gain amplifier 604, and second current source 608 on a common array may cause a delay difference between first and second amplifiers 602 and 604 to be relatively small (e.g., negligible) and/or may reduce layout overhead associated with amplifier 600.

The additional loading of main amplifier 602 by negative-gain amplifier 604 may be compensated by adjusting an inductance of first inductor L1 and/or an inductance of second inductor L2.

In an example embodiment, second current source 608 includes a current digital-to-analog converter (DAC). The current DAC may be controllable to provide an analog bias current for negative-gain amplifier 604 such that an amplitude of the analog bias current is based on a digital (e.g., binary) value. A gain profile of negative-gain amplifier 604 may be programmed into the current DAC. The gain profile may include a plurality of gain values that correspond to a plurality of respective amplitudes of an input signal (e.g., Vip-Vin) of amplifier 600. In accordance with this embodiment, the bias current of negative-gain amplifier 604 (e.g., the second differential pair X3 and X4 therein) may be varied through the current DAC to adjust the gain and/or gain profile of negative-gain amplifier 604, thereby adjusting the total harmonic distortion (THD) of amplifier 600.

Figure 7:
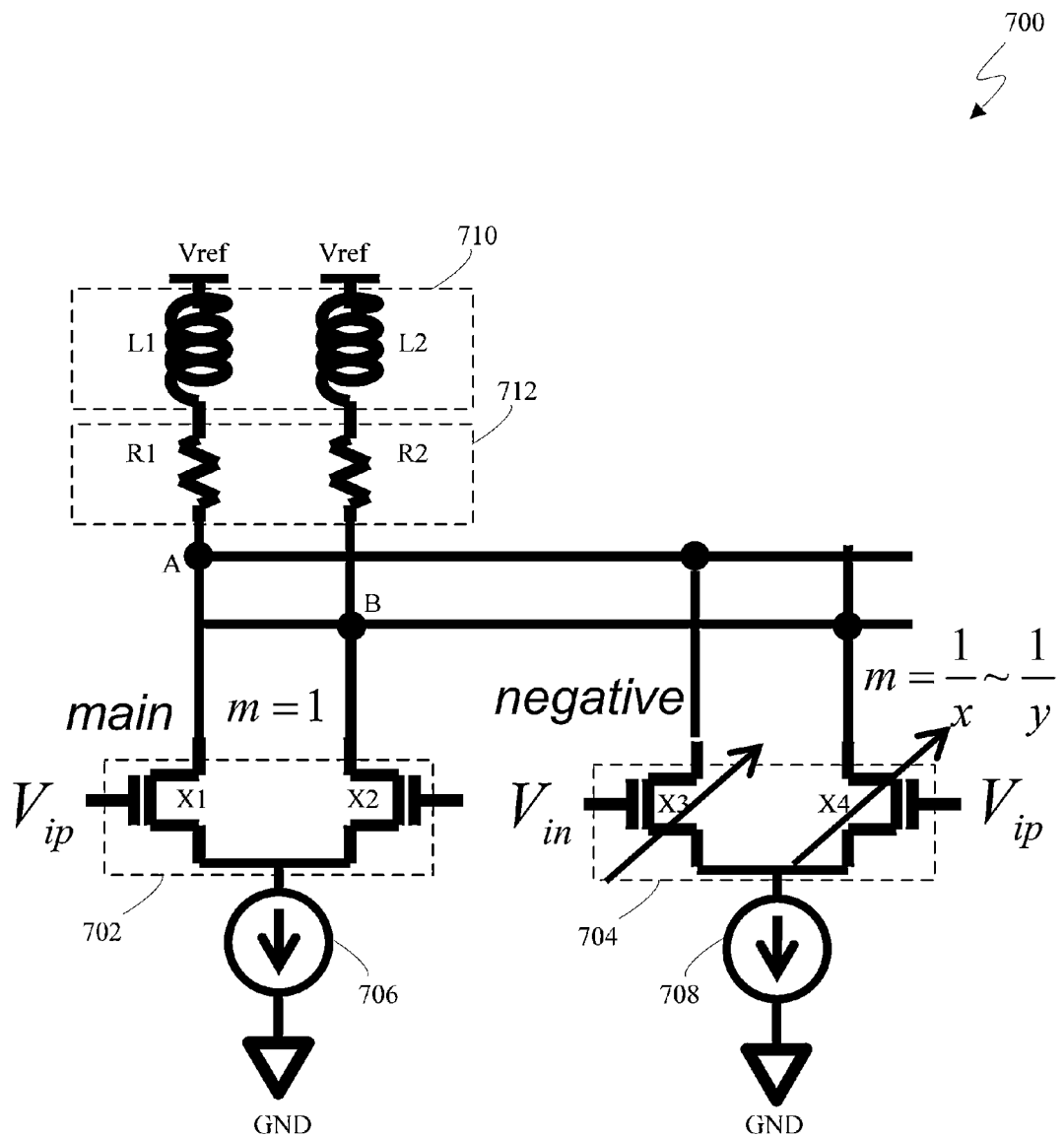

FIG. 7 is a block diagram of an opposing-gain shunt-peaking amplifier 700, which is another example implementation of opposing-gain shunt peaking amplifier 102 shown in FIG. 1, in accordance with an embodiment described herein. Amplifier 700 includes a main amplifier 702, a negative-gain amplifier 704, a first current source 706, a second current source 708, shunt-peaking circuitry 710, and resistor circuitry 712, all of which operate similarly to main amplifier 602, negative-gain amplifier 604, first current source 606, second current source 608, shunt-peaking circuitry 610, and resistor circuitry 612, respectively, shown in FIG. 6, except that the third transistor X3 and the fourth transistor X4 are variable in FIG. 7. For example, the third transistor X3 and the fourth transistor X4 may be switchable.

In another example, the third transistor X3 and the fourth transistor X4 may have a thermal voltage (VT) that is different from the VT of the first transistor X1 and the second transistor X2. For instance, the different VT may be achieved through adjustment of a well-potential of the third transistor X3 and/or the fourth transistor X4. In yet another example, the VT of the third transistor X3 and the VT of the fourth transistor may be different. If the VT of a transistor is relatively high, the transistor is less likely to conduct current, causing the gain associated with the transistor to be relatively low. If the VT of a transistor is relatively low, the transistor is more likely to conduct current, causing the gain associated with the transistor to be relatively high.

Although neither first current source 706 nor second current source 708 is shown to be a variable current source in FIG. 6, it will be recognized that first current source 706 and/or second current source 708 may be a variable current source.

By incorporating switchable differential pairs or differential pairs with different VT through well-potential adjustment in negative-gain amplifier 704, THD of amplifier 700 may be suppressed.

Figure 8:
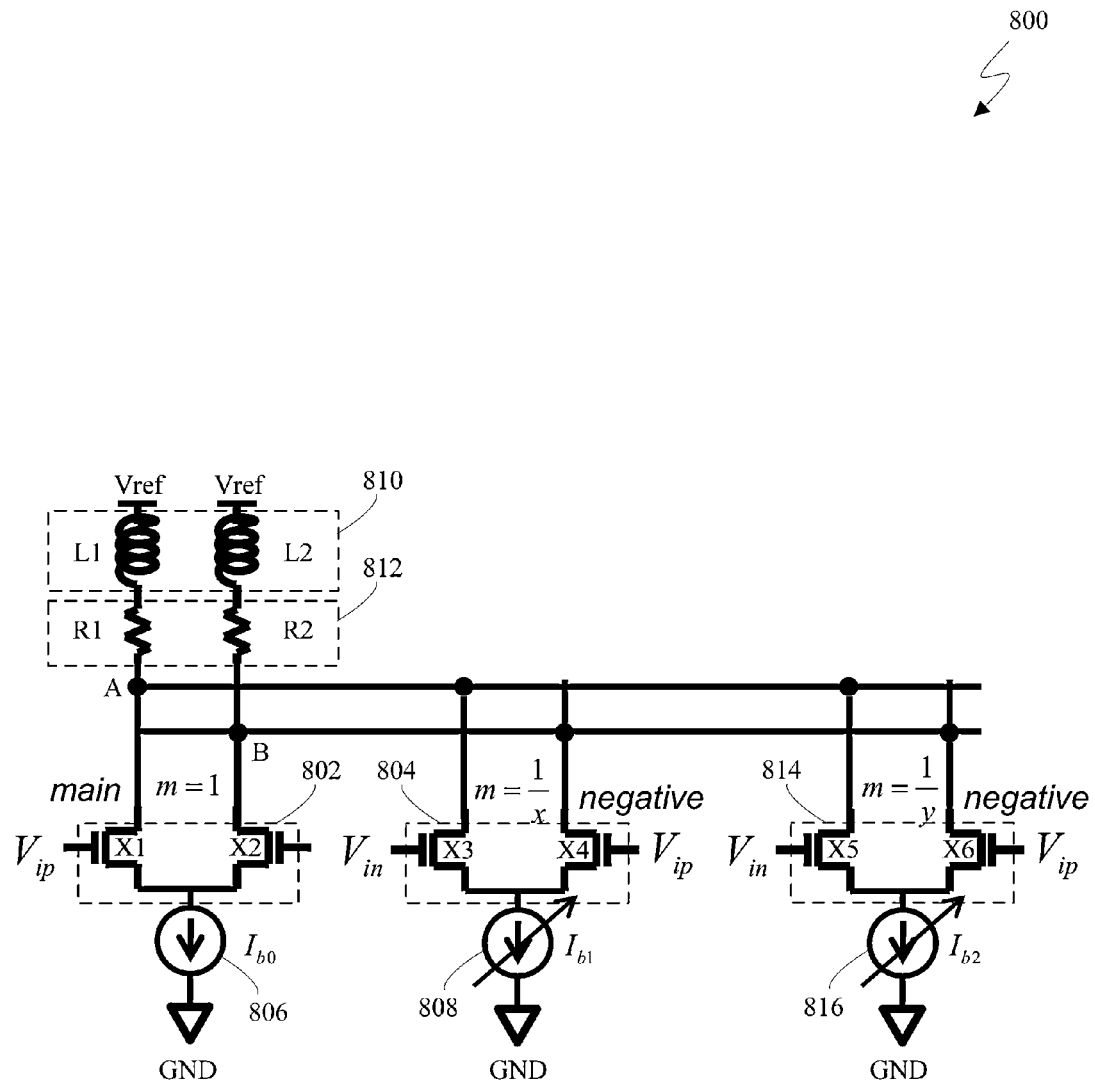

FIG. 8 is a block diagram of an opposing-gain shunt-peaking amplifier 800, which is yet another example implementation of opposing-gain shunt peaking amplifier 102 shown in FIG. 1, in accordance with an embodiment described herein. Amplifier 800 includes a main amplifier 802, a first negative-gain amplifier 804, a first current source 806, a second current source 808, shunt-peaking circuitry 810, and resistor circuitry 812, all of which operate similarly to main amplifier 602, negative-gain amplifier 604, first current source 606, second current source 608, shunt-peaking circuitry 610, and resistor circuitry 612, respectively, shown in FIG. 6.

Amplifier 800 further includes a second negative-gain amplifier 814 and a third current source 816. Second negative-gain amplifier 814 and third current source 816 operate similarly to first negative-gain amplifier 804 and second current source 808, respectively. Second negative-gain amplifier 814 includes a fifth transistor X5 and a sixth transistor X6 configured as a third differential pair. A drain of fifth transistor X5 is coupled to node A. A source of fifth transistor X5 is coupled to third current source 816. A gate of fifth transistor X5 is coupled to the second input voltage Vin. A drain of sixth transistor X6 is coupled to node B. A source of sixth transistor X6 is coupled to third current source 816. A gate of sixth transistor X6 is coupled to the first input voltage Vip. Accordingly, second negative-gain amplifier 814 has a reverse input configuration as compared to main amplifier 602. An absolute value of a gain of second negative-gain amplifier 814 is shown to be less than one in FIG. 8 for illustrative purposes (depicted as m=1/y, where y is a real number (e.g., integer or non-integer) greater than one), though the scope of the example embodiments is not limited in this respect. It will be recognized that the gain of second negative-gain amplifier 814 may be any suitable value. The gain of first negative-gain amplifier 804 and the gain of second negative-gain amplifier 814 may be same or different. In one example, x may equal y. In another example, x may not equal y.

Although two negative-gain amplifiers 804 and 814 (and corresponding current sources) are shown in FIG. 8 for illustrative purposes, it will be recognized that amplifier 800 may include any number of negative-gain amplifiers (and corresponding current sources). Each negative-gain amplifier may include its own differential pair of transistors. It will be recognized that different differential pairs in the respective negative-gain amplifiers may have different transconductance profiles. The transconductance profile for each differential pair may include a plurality of transconductance values that correspond to a plurality of respective amplitudes of an input signal (e.g., Vip-Vin) of amplifier 800.

The different differential pairs in the respective negative-gain amplifiers may be different sizes, have different bias currents, and/or have different device VT values. Accordingly, each of the negative-gain amplifiers 804 and 814 may be configured (e.g., optimized) to suppress harmonic distortion of input signals having respective amplitudes in a different amplitude range. For example, differential pair X3 and X4 in first negative-gain amplifier 804 may be configured to have a first negative gain to suppress harmonic distortion of input signals having respective amplitudes in a first range; differential pair X5 and X6 in second negative-gain amplifier 814 may be configured to have a second negative gain, which is different from the first negative gain, to suppress harmonic distortion of input signals having respective amplitudes in a second range (e.g., that does not overlap the first range), and so on. Accordingly, each of the negative-gain amplifiers may have a respective gain that differs from the negative gain(s) of the other negative-gain amplifier(s) to suppress harmonic distortion of input signals having amplitudes in the respective range that corresponds to that negative-gain amplifier. In the embodiment depicted in FIG. 8, differential pair X3 and X4 in first negative-gain amplifier 804 may be configured to suppress harmonic distortion of input signals having respective amplitudes that are less than a threshold; differential pair X5 and X6 in second negative-gain amplifier 814 may be configured to suppress harmonic distortion of input signals having respective amplitudes that are greater than the threshold.

Problem(s) with non-linearity may arise in components other than or in addition to the opposing-gain shunt-peaking amplifiers described herein. Even if such an opposing-gain shunt-peaking amplifier is capable of suppressing non-linearity of its own, the overall non-linearity of the system (e.g., ADC-based receiver) that includes the opposing-gain shunt-peaking amplifier may be dominated by one or more of the other components therein. The opposing-gain shunt-peaking amplifier can be programmed to be over-compensated so that it provides pre-distortion with regard to a signal that is to be provided to a dominant non-linearity source or post-distortion with regard to a signal that is received from a dominant non-linearity source. The opposing-gain shunt-peaking amplifier can thereby compensate for at least some distortion that arises from other component(s) (e.g., stages in the signal path).

Figure 9:
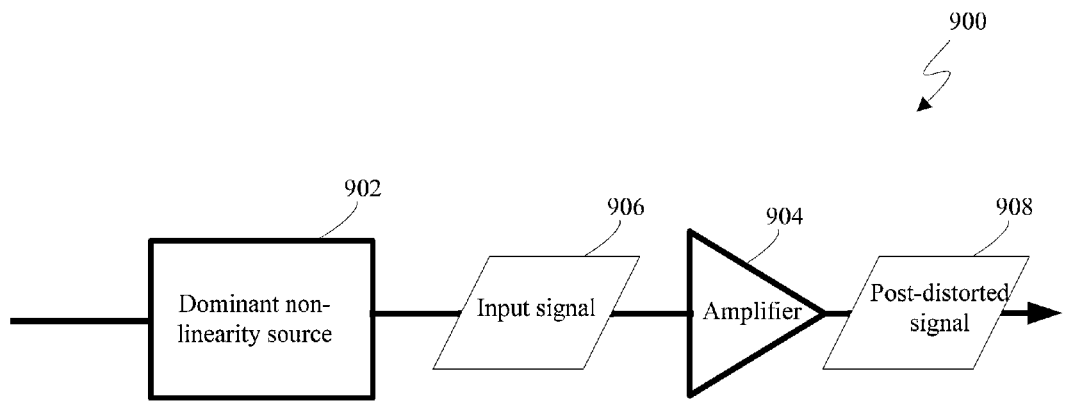
FIG. 9 is a block diagram of an example system in which an amplifier provides post-distortion with regard to a signal received from a dominant non-linearity source in accordance with an embodiment described herein.

FIG. 9 is a block diagram of an example system 900 in which an amplifier (e.g., an opposing-gain shunt-peaking amplifier) provides post-distortion with regard to a signal received from a dominant non-linearity source in accordance with an embodiment described herein. As shown in FIG. 9, system 900 includes a dominant non-linearity source 902 and an amplifier 904. Dominant non-linearity source 902 provides an input signal 906 to amplifier 904. Amplifier 904 adds distortion to the input signal 906 to provide a post-distorted signal 908. The distortion that is added by amplifier 904 may compensate for distortion that is included in the input signal 906. For instance, the distortion that is added by amplifier 904 may compensate for distortion that dominant non-linearity source 902 adds to the input signal.

Figure 10:
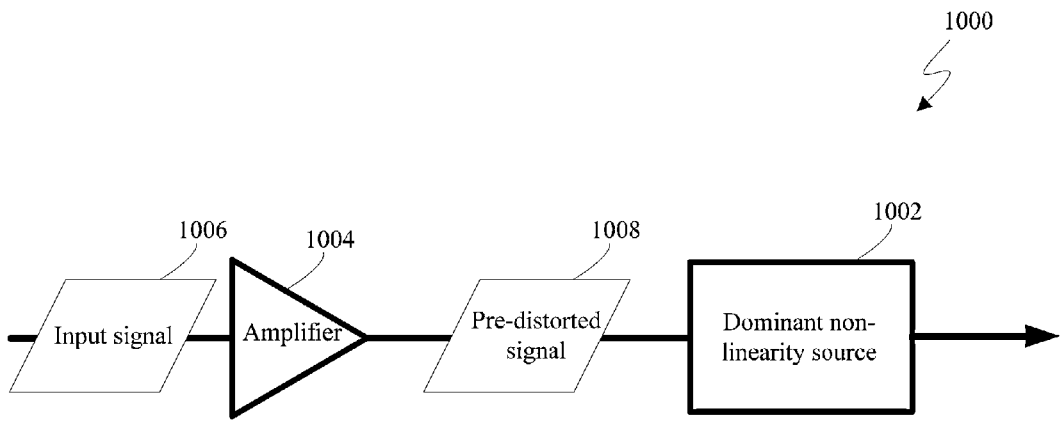
FIG. 10 is a block diagram of an example system in which an amplifier provides pre-distortion with regard to a signal that is to be provided to a dominant non-linearity source in accordance with an embodiment described herein.

FIG. 10 is a block diagram of an example system 1000 in which an amplifier (e.g., an opposing-gain shunt-peaking amplifier) provides pre-distortion with regard to a signal that is to be provided to a dominant non-linearity source in accordance with an embodiment described herein. As shown in FIG. 10, system 1000 includes a dominant non-linearity source 1002 and an amplifier 1004. Amplifier 1004 adds distortion to an input signal 1006 to provide a pre-distorted signal 1008 to dominant non-linearity source 1002. The distortion that is added by amplifier 1004 may compensate for distortion that dominant non-linearity source 1002 is expected to introduce.

Figure 11:
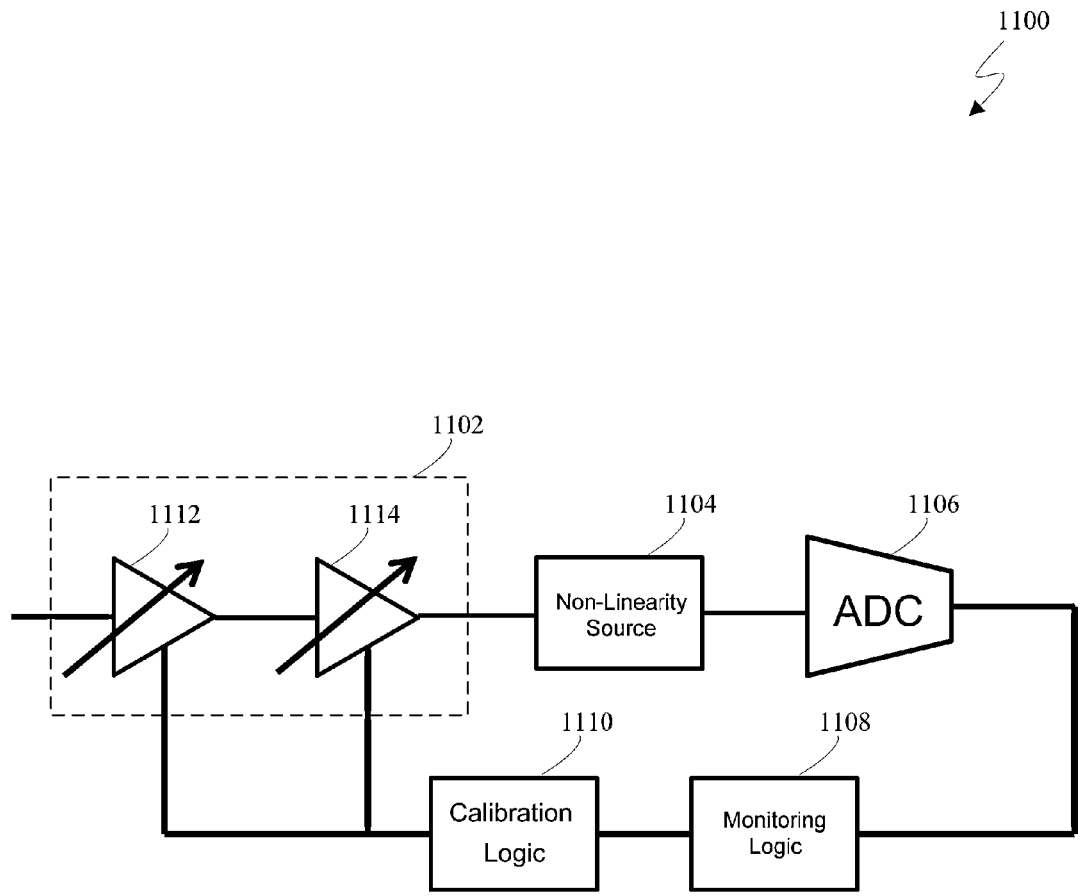
FIG. 11 is a block diagram of an example system in accordance with an embodiment described herein.

FIG. 11 is a block diagram of an example system 1100 (e.g., receiver) in accordance with an embodiment described herein. System 1100 includes a plurality of opposing-gain shunt-peaking amplifiers 1102, a non-linearity source 1104, an analog-to-digital converter (ADC) 1106, monitoring logic 1108, and calibration logic 1110. The plurality of opposing-gain shunt-peaking amplifiers 1102 includes a first opposing-gain shunt-peaking amplifier 1112 and a second opposing-gain shunt-peaking amplifier 1114 for illustrative purposes, though it will be recognized that the plurality of opposing-gain shunt-peaking amplifiers 1102 may include any suitable number of opposing-gain shunt-peaking amplifiers (e.g., 2, 3, 4, and so on). The plurality of opposing-gain shunt-peaking amplifiers 1102 enable system 1100 to provide a gain that is greater than a single opposing-gain shunt-peaking amplifier is capable of providing. Each of the plurality of opposing-gain shunt-peaking amplifiers 1102 may provide any respective portion of the gain of system 1100.

As shown in FIG. 11, first opposing-gain shunt-peaking amplifier 1112 and second opposing-gain shunt-peaking amplifier 1114 are configured to have adjustable THD control. First amplifier 1112 and second amplifier 1114 are included in a feedback loop to suppress harmonic distortion adaptively. By using the feedback loop, THD suppression (e.g., cancellation) may be controlled in a more flexible manner. First amplifier 1112 may be controlled by a first control signal, and second amplifier 1114 may be controlled by a second control signal. First amplifier 112 and second amplifier 1114 therefore may be controlled independently from each other.

Non-linearity source 1104 is a source of non-linearity. Amplifier 1102 is configured to compensate for the non-linearity that is introduced by non-linearity source 1104 in accordance with one or more of the techniques described herein. For illustrative purposes, non-linearity source 1104 is shown to be connected to an output of the plurality of opposing-gain shunt-peaking amplifiers 1102 such that the plurality of opposing-gain shunt-peaking amplifiers 1102 may provide pre-distortion with regard to a signal that is to be provided to a non-linearity source 1104. It will be recognized that non-linearity source 1104 need not necessarily be connected directly or indirectly to an output of the plurality of opposing-gain shunt-peaking amplifiers 1102. For instance, non-linearity source 1104 may be connected to an input of the plurality of opposing-gain shunt-peaking amplifiers 1102 such that the plurality of opposing-gain shunt-peaking amplifiers 1102 may provide post-distortion with regard to a signal received from non-linearity source 1104.

ADC 1106 converts analog signals to digital signals. Accordingly, an output of ADC 1106 may include a digital representation of the non-linearity that is provided by non-linearity source 1104.

Monitoring logic 1108 monitors THD that is included in the output of ADC 1106. For instance, monitoring logic 1108 may provide information that indicates an extent of the THD that is included in the output of ADC 1106.

Calibration logic 1110 calibrates the THD control of first opposing-gain shunt-peaking amplifier 1112 and second opposing-gain shunt-peaking amplifier 1114. For example, calibration logic 1110 may calibrate the THD control of first opposing-gain shunt-peaking amplifier 1112 and second opposing-gain shunt-peaking amplifier 1114 to compensate for the THD that is detected by monitoring logic 1108. In accordance with this example, calibration logic 1110 may calibrate the THD control based on the information that is generated by monitoring logic 1108.

Calibration logic 1110 may calibrate the THD control to adjust any of a variety of attributes of first opposing-gain shunt-peaking amplifier 1112 and/or second opposing-gain shunt-peaking amplifier 1114 (e.g., to compensate for THD of system 1100). For example, calibration logic 1110 may calibrate the THD control to change a bias current of first opposing-gain shunt-peaking amplifier 1112 and/or a bias current of second opposing-gain shunt-peaking amplifier 1114. In another example, calibration logic 1110 may calibrate the THD control to change a number of gates that are utilized in transistors included in first opposing-gain shunt-peaking amplifier 1112 and/or a number of gates that are utilized in transistors included in second opposing-gain shunt-peaking amplifier 1114. In yet another example, calibration logic 1110 may calibrate the THD control to change a potential of wells in respective transistors included in first opposing-gain shunt-peaking amplifier 1112 and/or a potential of wells in respective transistors included in second opposing-gain shunt-peaking amplifier 1114.

Figure 12:
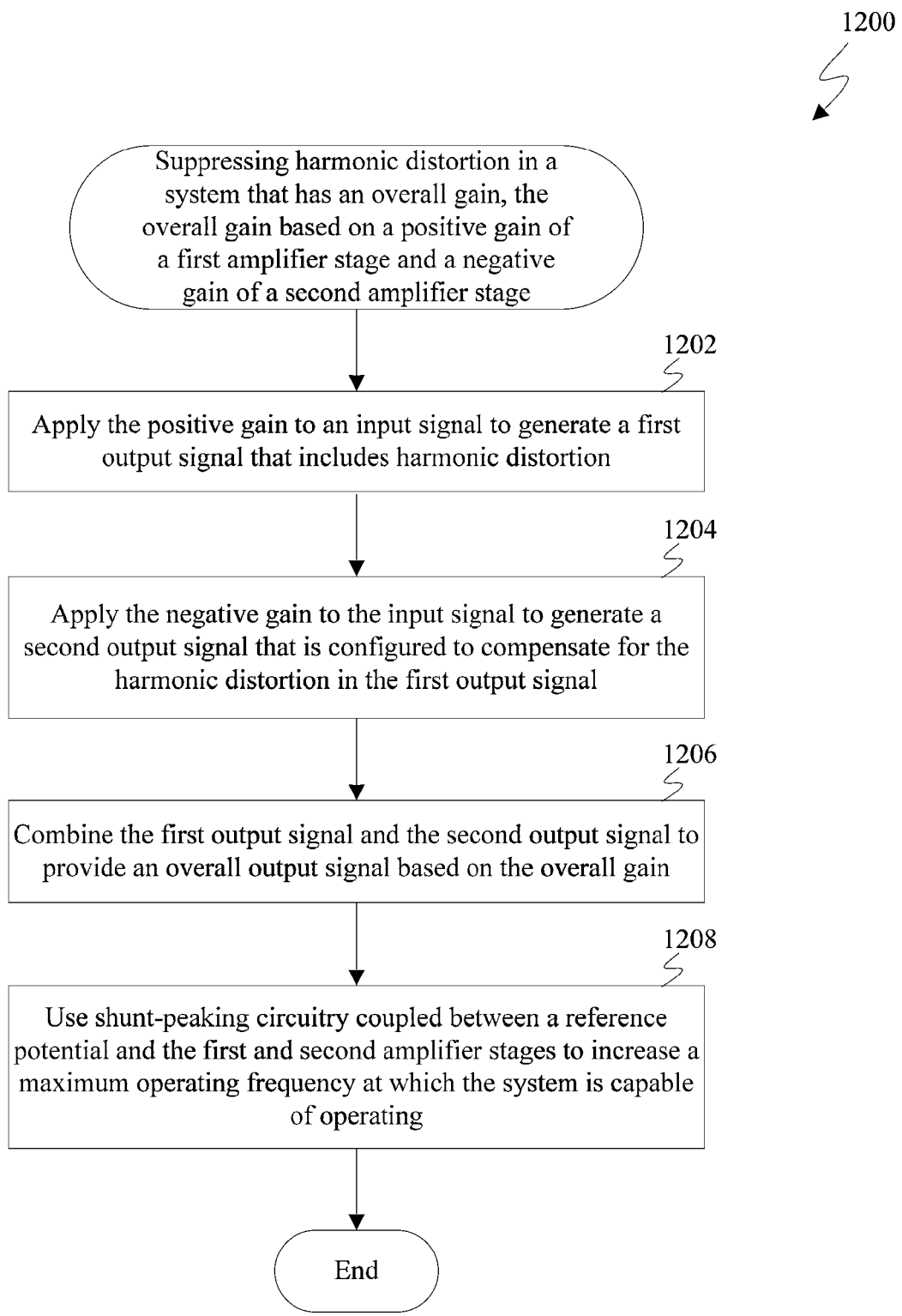
FIG. 12 depicts a flowchart of an example method for suppressing harmonic distortion in accordance with an embodiment described herein.

FIG. 12 depicts a flowchart 1200 of an example method for suppressing harmonic distortion in accordance with an embodiment described herein. Flowchart 1200 may be performed by an opposing-gain shunt-peaking amplifier, such as amplifier 200 shown in FIG. 2, amplifier 600 shown in FIG. 6, amplifier 700 shown in FIG. 7, or amplifier 800 shown in FIG. 8. For illustrative purposes, flowchart 1200 is described with respect to amplifiers 200, 600, 700, and 800. Further structural and operational embodiments will be apparent to persons skilled in the relevant art(s) based on the discussion regarding flowchart 1200.

As shown in FIG. 12, the method of flowchart 1200 begins at step 1202. In step 1202, a positive gain of a first amplifier stage is applied to an input signal to generate a first output signal that includes harmonic distortion. In an example implementation, first amplifier stage 202, 602, 702, or 802 applies the positive gain to the input signal to generate the first output signal.

At step 1204, a negative gain of a second amplifier stage is applied to the input signal to generate a second output signal that is configured to compensate for the harmonic distortion in the first output signal. In an example implementation, second amplifier stage 204, 604, 704, 804, or 814 applies the negative gain to the input signal to generate the second output signal.

At step 1206, the first output signal and the second output signal are combined to provide an overall output signal based on an overall gain of a system. The overall gain is based on the positive gain of the first amplifier stage and the negative gain of the second amplifier stage. In an example implementation, combiner 206 combines the first output signal and the second output signal to provide the overall output signal.

At step 1208, shunt-peaking circuitry coupled between a reference potential and the first and second amplifier stages is used to increase a maximum operating frequency at which the system is capable of operating. In an example implementation, shunt-peaking circuitry 610, 710, or 810 is used to increase the maximum operating frequency.

In some example embodiments, one or more steps 1202, 1204, 1206, and/or 1208 of flowchart 1200 may not be performed. Moreover, steps in addition to or in lieu of steps 1202, 1204, 1206, and/or 1208 may be performed.

Figure 13:
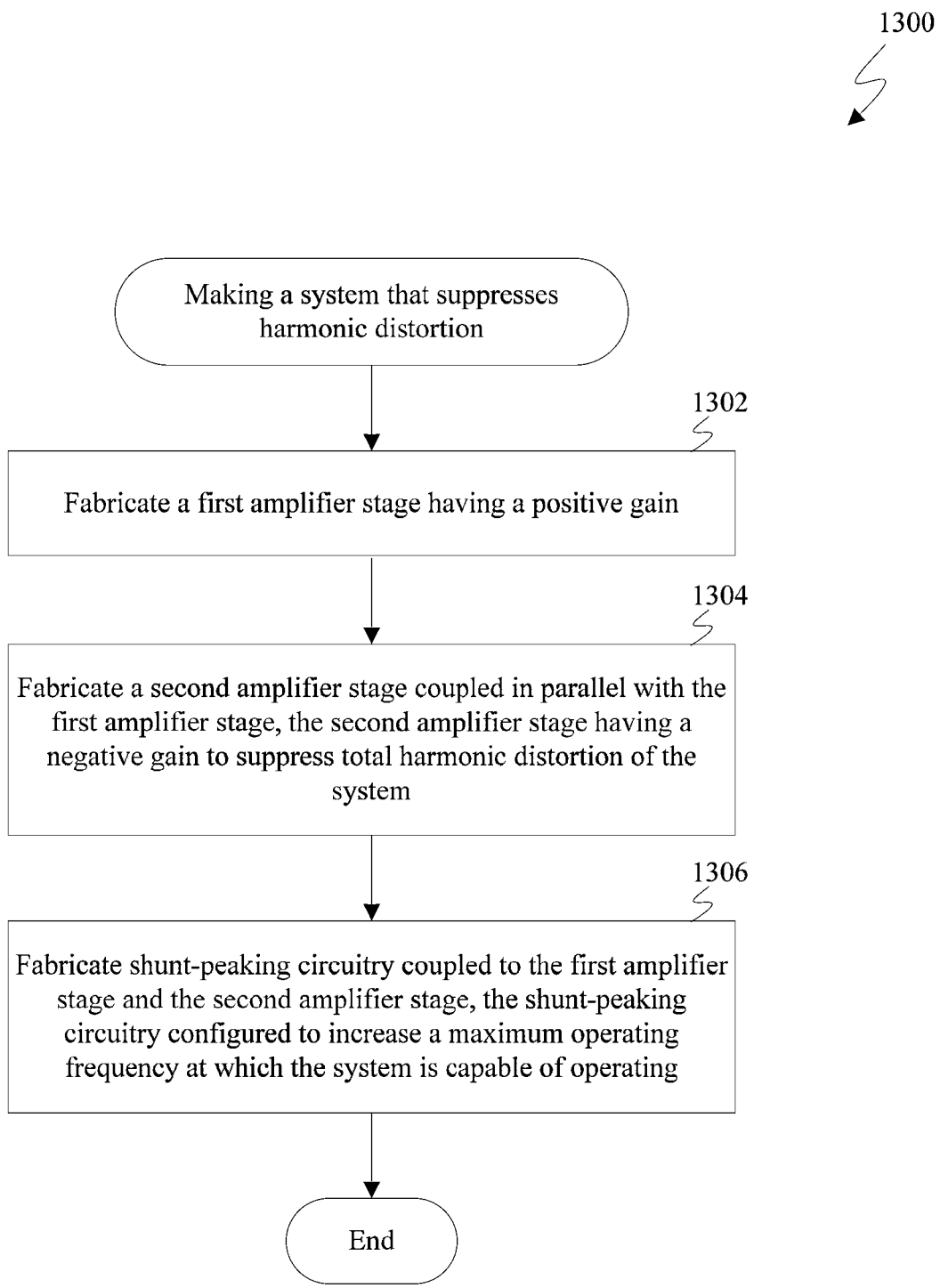
FIG. 13 depicts a flowchart of an example method for making a system that suppresses harmonic distortion in accordance with an embodiment described herein.

FIG. 13 depicts a flowchart 1300 of an example method for making a system that suppresses harmonic distortion in accordance with an embodiment described herein. As shown in FIG. 13, the method of flowchart 1300 begins at step 1302. In step 1302, a first amplifier stage having a positive gain is fabricated.

At step 1304, a second amplifier stage coupled in parallel with the first amplifier stage is fabricated. The second amplifier stage has a negative gain to suppress total harmonic distortion of the system.

At step 1306, shunt-peaking circuitry coupled to the first amplifier stage and the second amplifier stage is fabricated. The shunt-peaking circuitry is configured to increase a maximum operating frequency at which the system is capable of operating.

First amplifier stage, second amplifier stage, and shunt-peaking circuitry may be fabricated on a common substrate (e.g., during a common wafer fabrication run), though the scope of the example embodiments is not limited in this respect. It will be recognized that each of steps 1302, 1304, and 1306 may include any of a variety of processing operations, including but not limited to photolithography, ion implantation (a.k.a. doping), etching (e.g., dry etching or wet etching), plasma ashing, annealing, deposition, etc. It will also be recognized that any suitable processing machinery may be used to perform any one or more of steps 1302, 1304, and/or 1306. For instance, such processing machinery may be configured to perform any one or more of the processing operations mentioned above.

In some example embodiments, one or more steps 1302, 1304, and/or 1306 of flowchart 1300 may not be performed.

Moreover, steps in addition to or in lieu of steps 1302, 1304, and/or 1306 may be performed.

The disclosed technologies can be put into practice using software, firmware, and/or hardware implementations other than those described herein. Any software, firmware, and hardware implementations suitable for performing the functions described herein can be used.

III. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A system comprising:
    a first amplifier stage having a positive gain;
    a second amplifier stage coupled in parallel with the first amplifier stage, the second amplifier stage having a negative gain to suppress total harmonic distortion of the system; and
    shunt-peaking circuitry coupled to the first amplifier stage and the second amplifier stage, the shunt-peaking circuitry configured to increase a maximum operating frequency at which the system is capable of operating.

2. The system of claim 1, wherein the system has an overall gain based on the positive gain of the first amplifier stage and the negative gain of the second amplifier stage; and
    wherein the negative gain of the second amplifier stage reduces dependency of the overall gain on an input amplitude of an input signal that is received by the system.

3. The system of claim 1, wherein the second amplifier stage is configured to suppress harmonic distortion that is introduced by the first amplifier stage.

4. The system of claim 1, wherein the first amplifier stage includes a first differential pair of transistors;
    wherein the second amplifier stage includes a second differential pair of transistors;
    wherein the shunt-peaking circuitry includes a first inductor and a second inductor;
    wherein the first differential pair of transistors includes a first transistor and a second transistor, a drain of the first transistor coupled to the first inductor, a gate of the first transistor coupled to a first input voltage, a source of the first transistor coupled to a first node, a drain of the second transistor coupled to the second inductor, a gate of the second transistor coupled to a second input voltage, a source of the second transistor coupled to the first node; and
    wherein the second differential pair of transistors includes a third transistor and a fourth transistor, a drain of the third transistor coupled to the first inductor, a gate of the third transistor coupled to the second input voltage, a source of the third transistor coupled to a second node, a drain of the fourth transistor coupled to the second inductor, a gate of the fourth transistor coupled to the first input voltage, a source of the fourth transistor coupled to the second node.

5. The system of claim 4, further comprising:
    a first current source coupled between the first node and a ground potential;
    a second current source coupled between the second node and the ground potential; and
    calibration logic configured to adjust the total harmonic distortion of the system by adjusting a biasing current that is provided by the second current source.

6. The system of claim 1, wherein the first amplifier stage includes a first differential pair of transistors;
    wherein the second amplifier stage includes a second differential pair of transistors;
    wherein the first differential pair of transistors includes a first transistor and a second transistor;
    wherein the second differential pair of transistors includes a third transistor and a fourth transistor; and
    wherein the third and fourth transistors are configured to have a thermal voltage that is different from a thermal voltage of the first and second transistors to facilitate suppression of the total harmonic distortion of the system.

7. The system of claim 1, wherein the first amplifier stage includes a first differential pair of transistors;
    wherein the second amplifier stage includes a second differential pair of transistors; and
    wherein the first differential pair of transistors and the second differential pair of transistors are configured to be switchable to facilitate suppression of the total harmonic distortion of the system.

8. The system of claim 1, wherein the second amplifier stage is included in a plurality of second amplifier stages that are coupled in parallel with the first amplifier stage, the plurality of second amplifier stages corresponding to a plurality of respective ranges of input amplitudes of input signals, each of the plurality of second amplifier stages configured to suppress harmonic distortion of input signals having input amplitudes in the respective range that corresponds to that second amplifier stage.

9. The system of claim 8, wherein each of the second amplifier stages has a size that is selected based on the respective range of input amplitudes that corresponds to that second amplifier stage.

10. The system of claim 8, wherein a bias current of each of the second amplifier stages is selected based on the respective range of input amplitudes that corresponds to that second amplifier stage.

11. The system of claim 8, wherein a thermal voltage of each of the second amplifier stages is selected based on the respective range of input amplitudes that corresponds to that second amplifier stage.

12. The system of claim 1, wherein the first amplifier stage and the second amplifier stage are controlled by a feedback loop of the system to adaptively suppress the total harmonic distortion of the system.

13. The system of claim 1, further comprising:
    monitoring logic configured to monitor the total harmonic distortion of the system; and
    calibration logic configured to calibrate at least one of the positive gain of the first amplifier stage or the negative gain of the second amplifier stage to compensate for the total harmonic distortion of the system.

14. The system of claim 1, further comprising:
    a non-linearity source that provides harmonic distortion, which is included in the total harmonic distortion of the system;
    wherein at least one of the first amplifier stage or the second amplifier stage is configured to be over-compensated to provide pre-distortion with respect to a signal that is to be received by the non-linearity source to facilitate suppression of the total harmonic distortion of the system.

15. The system of claim 1, further comprising:
a non-linearity source that provides harmonic distortion, which is included in the total harmonic distortion of the system;
wherein at least one of the first amplifier stage or the second amplifier stage is configured to be over-compensated to provide post-distortion with respect to a signal that is received from the non-linearity source to facilitate suppression of the total harmonic distortion of the system.

16. A method of suppressing total harmonic distortion in a system that has an overall gain, the overall gain based on a positive gain of a first amplifier stage and a negative gain of a second amplifier stage, the method comprising:
applying the positive gain to an input signal to generate a first output signal that includes harmonic distortion;
applying the negative gain to the input signal to generate a second output signal that is configured to compensate for the harmonic distortion in the first output signal;
combining the first output signal and the second output signal to provide an overall output signal based on the overall gain; and
using shunt-peaking circuitry coupled between a reference potential and the first and second amplifier stages to increase a maximum operating frequency at which the system is capable of operating.

17. The method of claim 16, wherein the overall gain is dependent on an amplitude of the input signal to an extent that is less than an extent to which the positive gain of the first amplifier is dependent on the amplitude of the input signal.

18. The method of claim 16, further comprising:
adjusting an inductance value of the shunt-peaking circuitry to compensate for loading of the first amplifier stage that is caused by the second amplifier stage.

19. The method of claim 16, further comprising:
adjusting the total harmonic distortion of the system by adjusting a biasing current of the second amplifier stage.

20. A method comprising:
fabricating a first amplifier stage having a positive gain;
fabricating a second amplifier stage coupled in parallel with the first amplifier stage, the second amplifier stage having a negative gain to suppress total harmonic distortion of the system; and
fabricating shunt-peaking circuitry coupled to the first amplifier stage and the second amplifier stage, the shunt-peaking circuitry configured to increase a maximum operating frequency at which the system is capable of operating.

* * * * *